(12) United States Patent
Chen

(10) Patent No.: US 12,424,529 B2
(45) Date of Patent: Sep. 23, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Xiaoxuan Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 556 days.

(21) Appl. No.: 17/806,264

(22) Filed: Jun. 9, 2022

(65) Prior Publication Data

US 2023/0197589 A1    Jun. 22, 2023

Related U.S. Application Data

(63) Continuation of application No. PCT/CN2022/071228, filed on Jan. 11, 2022.

(30) Foreign Application Priority Data

Dec. 21, 2021    (CN) .......................... 202111570972.0

(51) Int. Cl.
  *H01L 23/498*    (2006.01)
  *H01L 21/48*    (2006.01)
  *H01L 23/00*    (2006.01)
  *H01L 25/065*    (2023.01)

(52) U.S. Cl.
  CPC .... *H01L 23/49811* (2013.01); *H01L 21/4846* (2013.01); *H01L 23/49838* (2013.01); *H01L 24/48* (2013.01); *H01L 25/0657* (2013.01); *H01L 24/32* (2013.01); *H01L 24/73* (2013.01); *H01L 2224/32145* (2013.01); *H01L 2224/32225* (2013.01); *H01L 2224/48229* (2013.01); *H01L 2224/73265* (2013.01); *H01L 2225/0651* (2013.01); *H01L 2225/06524* (2013.01); *H01L 2225/06562* (2013.01)

(58) Field of Classification Search
  CPC .................................................. H01L 23/49811
  See application file for complete search history.

(56) References Cited

U.S. PATENT DOCUMENTS

| 5,468,999 A | 11/1995 | Lin |
| 9,373,585 B2 | 6/2016 | Uzoh |
| 9,721,881 B1 | 8/2017 | Gong |
| 9,865,548 B2 | 1/2018 | Uzoh |
| 10,068,841 B2 | 9/2018 | Gong |

(Continued)

FOREIGN PATENT DOCUMENTS

| CN | 109075158 A | 12/2018 |
| JP | 2003133505 A | 5/2003 |
| KR | 20100088514 A | 8/2010 |

*Primary Examiner* — Yu-Hsi D Sun
(74) *Attorney, Agent, or Firm* — SYNCODA LLC; Feng Ma

(57) ABSTRACT

A semiconductor structure includes: a substrate, a first pad being provided on the substrate; an adapter plate located on the substrate, and the bottom surface of the adapter plate covering the first pad, in which the adapter plate includes a second pad and a connecting structure, the second pad is located on any surface other than the bottom surface of the adapter plate, one end of the connecting structure is connected with the first pad, and the other end of the connecting structure is connected with the second pad.

19 Claims, 20 Drawing Sheets

(56) References Cited

U.S. PATENT DOCUMENTS

| | | |
|---|---|---|
| 2016/0079169 A1 | 3/2016 | Uzoh et al. |
| 2016/0268205 A1 | 9/2016 | Uzoh et al. |
| 2017/0317020 A1 | 11/2017 | Gong et al. |
| 2020/0043895 A1 | 2/2020 | Dupre |
| 2022/0399296 A1* | 12/2022 | Kim .................... H01L 25/0655 |

* cited by examiner

SEMICONDUCTOR STRUCTURE AND MANUFACTURING METHOD THEREOF

CROSS-REFERENCE TO RELATED APPLICATIONS

This application is a continuation application of International Application No. PCT/CN2022/071228 filed on Jan. 11, 2022, which claims priority to Chinese Patent Application No. 202111570972.0 filed on Dec. 21, 2021. The disclosures of these applications are hereby incorporated by reference in their entirety.

BACKGROUND

A semiconductor structure includes a substrate and one or more dies on the substrate, the surface of the substrate is provided with pads, the dies is electrically connected to the pad on the surface of the substrate by a bonding wire.

However, with the development of semiconductor structures towards small size and high integration, the arrangement density of pads on the substrate surface is increasing, and short circuits easily occur between adjacent pads and adjacent bonding wires, which affects the reliability of semiconductor structures.

SUMMARY

The disclosure relates to the field of semiconductor manufacturing, in particular to a semiconductor structure and a manufacturing method thereof.

The embodiments of the disclosure provide a semiconductor structure and the semiconductor structure includes a substrate and an adapter plate located on the substrate.

A first pad is provided on the substrate.

A bottom surface of the adapter plate covers the first pad, the adapter plate includes a second pad and a connecting structure, the second pad is located on any surface other than the bottom surface of the adapter plate of the adapter plate, one end of the connecting structure is connected with the first pad, and the other end of the connecting is connected with the second pad.

The embodiments of the disclosure also provide a manufacturing method of a semiconductor structure, the method includes: providing a substrate, a first pad being provided on a surface of the substrate; forming an adapter plate on the substrate, which includes: forming a connecting structure and a second pad, in which the second pad is located on any surface other than a bottom surface of the adapter plate.

One end of the connecting structure is connected with the first pad, and another end of the connecting structure is connected with the second pad.

Details of one or more embodiments of the disclosure are set forth in the following drawings and descriptions. Other features and advantages of the disclosure will become apparent from the drawings of the specification and claims.

BRIEF DESCRIPTION OF THE DRAWINGS

For the purpose of more clearly explaining the technical solution of the embodiments of the disclosure, the drawings required by the embodiments will be briefly described below, and it will be apparent that the drawings described below are only some embodiments of the disclosure, from which other drawings can be obtained without creative effort by a person of ordinary skill in the art.

DETAILED DESCRIPTION

Figure 1A:
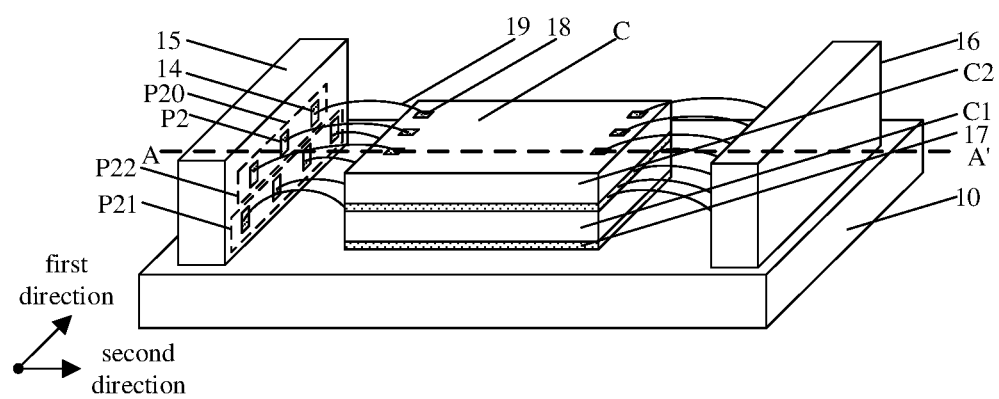
FIG. 1A is a perspective view of a semiconductor structure provided by the embodiments of the disclosure.

Exemplary embodiments of the disclosure will be described in more detail below with reference to the accompanying drawings. Although the exemplary embodiments of the disclosure are shown in the accompanying drawings, it should be understood that, the disclosure may be embodied in various forms and should not be limited by the specific embodiments set forth herein. On the contrary, these embodiments are provided to enable a more thorough understanding of the disclosure and to fully convey the scope of the disclosure to those skilled in the art.

In the following description, numerous specific details are given to provide a more thorough understanding of the disclosure. However, it will be apparent to those skilled in the art that the disclosure may be practiced without one or more of these details. In other examples, some technical features well known in the art are not described in order to avoid confusion with the disclosure; that is, all features of the actual embodiments are not described herein and well-known functions and structures are not described in detail.

In the drawings, the dimensions of layers, regions, elements and their relative dimensions may be exaggerated for clarity. Throughout, the same reference numerals denote the same elements.

It should be understood that, when an element or layer is referred to as "on", "adjacent to", "connected to" or "coupled to" another element or layer, it may be directly on, adjacent to, connected to, or coupled to the another element or layer, or there may be intervening elements or layers. Conversely, when an element is referred to as "directly on", "directly adjacent to", "directly connected to" or "directly coupled to" another element or layer, there is no intervening element or layer. It should be understood that while the terms "first", "second", "third", etc. may be used to describe various elements, components, regions, layers, and/or portions, such elements, components, regions, layers, and/or portions should not be limited by such terms. These terms are used only to distinguish one element, component, region, layer, or portion from another element, component, region, layer, or portion. Thus, a first element, component, region, layer, or portion discussed below may be represented as a second element, component, region, layer, or portion without departing from the teachings of the disclosure. The discussion of a second element, component, region, layer, or portion does not imply that the disclosure necessarily has a first element, component, region, layer, or portion.

Spatial relation terms such as "under", "underneath", "down", "below", "on", "above", etc. may be used herein for convenience of description to describe the relationship of one element or feature with other elements or features shown in the figure. It should be understood that, the spatial relationship terms are intended to include different orientations of devices in use and operation in addition to the orientations shown in the figures. For example, if a device in the drawing is flipped, then the element or feature described as "under" or "below" or "beneath" the other elements or features will be oriented "above" the other elements or features. Thus, the example terms "under" and "below" may include both upper and lower orientations. The device may be additionally oriented (rotated 90 degrees or otherwise) and the spatial relationship terms used herein are interpreted accordingly.

The terms used herein are intended to describe specific embodiments only and is not to be a limitation of the disclosure. As used herein, the singular forms of "a", "an" and "said/the" are also intended to include the plural forms, unless the context clearly indicates otherwise. It should also be understood that the terms "including" and/or "comprising", when used in this specification, determine the presence of said features, integers, steps, operations, elements and/or components, but do not exclude the presence or addition of one or more other features, integers, steps, operations, elements, components and/or groups. As used herein, the term "and/or" includes anyone and all combinations of related listed items.

A semiconductor structure includes a substrate and one or more dies located on the substrate, the surface of the substrate is provided with a pad, the die is electrically connected to the pad on the surface of the substrate by a bonding wire. With the development of semiconductor structure towards small size and high integration, the size of substrate gradually decreases, and the number of pads gradually increases, which makes the arrangement density of pads increasing. During wire bonding, short circuit easily occurs between adjacent pads and adjacent bonding wires, which affects the reliability of semiconductor structure.

Based on this, the following technical solutions of the embodiments of the disclosure are proposed.

The embodiments of the disclosure provides a semiconductor structure and the semiconductor structure includes: a substrate having a first pad; an adapter plate located on the substrate, and the bottom surface of the adapter plate covering the first pad, in which the adapter plate includes a second pad and a connecting structure, the second pad is located on any surface other than the bottom surface of the adapter plate, one end of the connecting structure is connected with the first pad, and the other end of the connecting structure is connected with the second pad.

In the embodiments of the disclosure, the first pad located on the substrate is led to any surface other than the bottom surface of the adapter plate by the connecting structure to form the second pad. The adapter plate is located on the substrate, and the side surface of the adapter plate has a larger area, so that the arrangement density of the second pads may be smaller than the arrangement density of the first pads, and the possibility of short circuit between adjacent second pads and between adjacent bonding wires can be reduced during wire bonding. The semiconductor structure provided by the embodiments of the disclosure may have a smaller substrate size, more pads, and a lower pad arrangement density compared to conventional techniques. In addition, the existence of the adapter plate can also shorten the length of the bonding wire, thereby reducing heat generation and signal attenuation.

Specific embodiments of the disclosure will be described in detail below with reference to the accompanying drawings. When describing the embodiments of the present disclosure in detail, for the sake of illustration, the schematic diagrams will not be partially enlarged to the general scale, and the schematic diagrams are only examples, which should not limit the scope of protection of the disclosure.

Figure 1B:
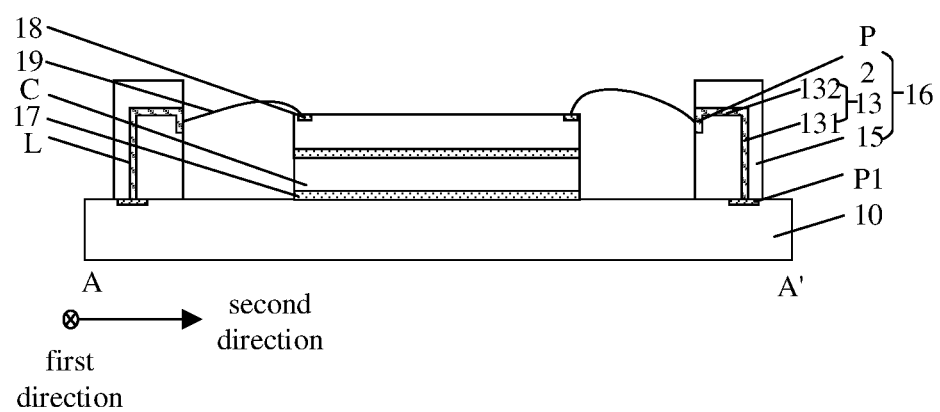
FIG. 1B is a schematic cross-section structure diagram taken along the line A-A' of FIG. 1A.
Figure 1C:
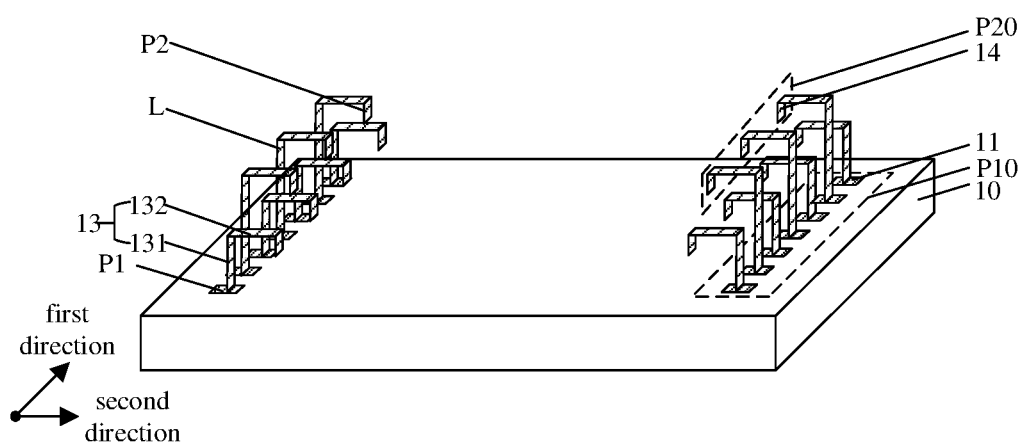
FIG. 1C is a perspective view of first pad and connecting structure in FIG. 1A.
Figure 2A:
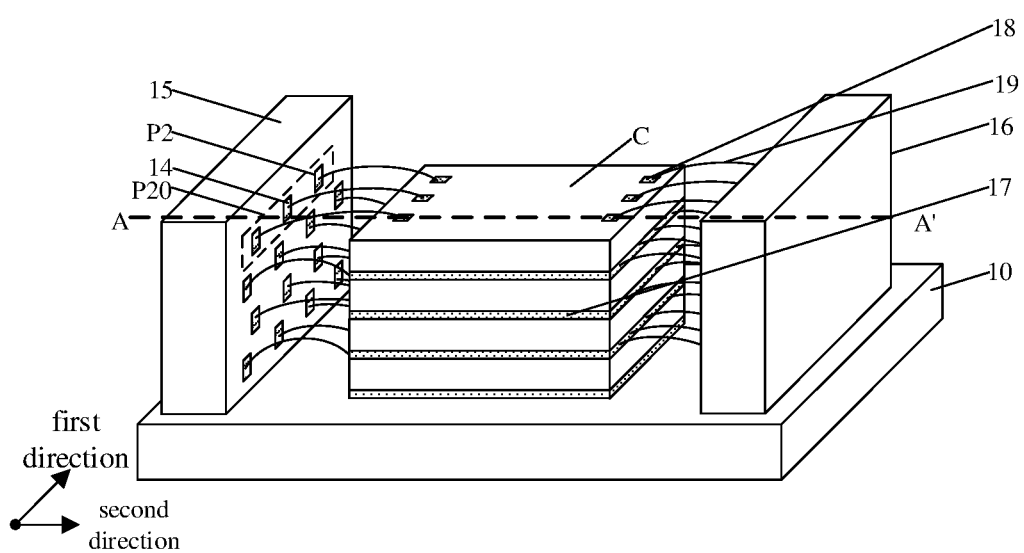
FIG. 2A is a perspective view of a semiconductor structure provided by another embodiment of the disclosure.
Figure 2B:
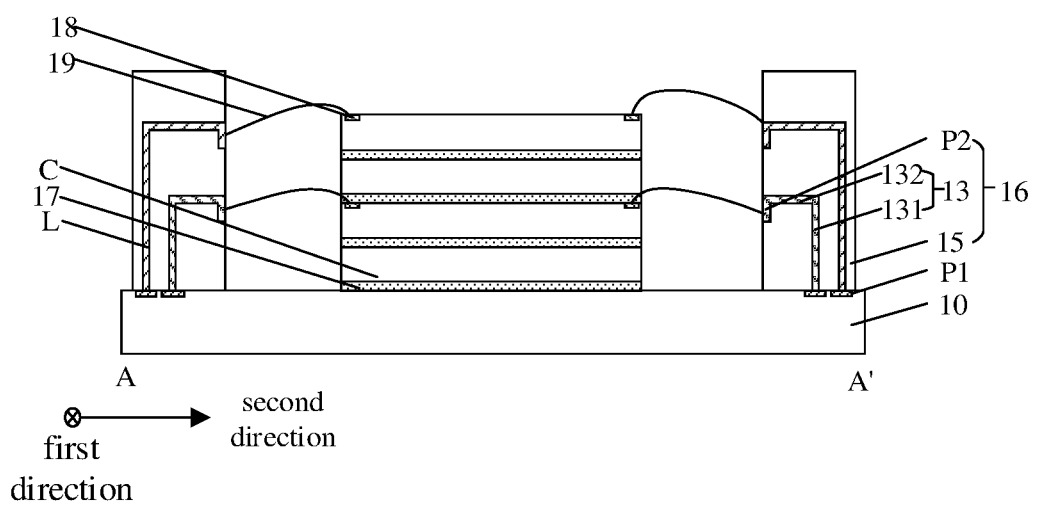
FIG. 2B is a schematic cross-section structure diagram taken along line A-A' of FIG. 2A.
Figure 3A:
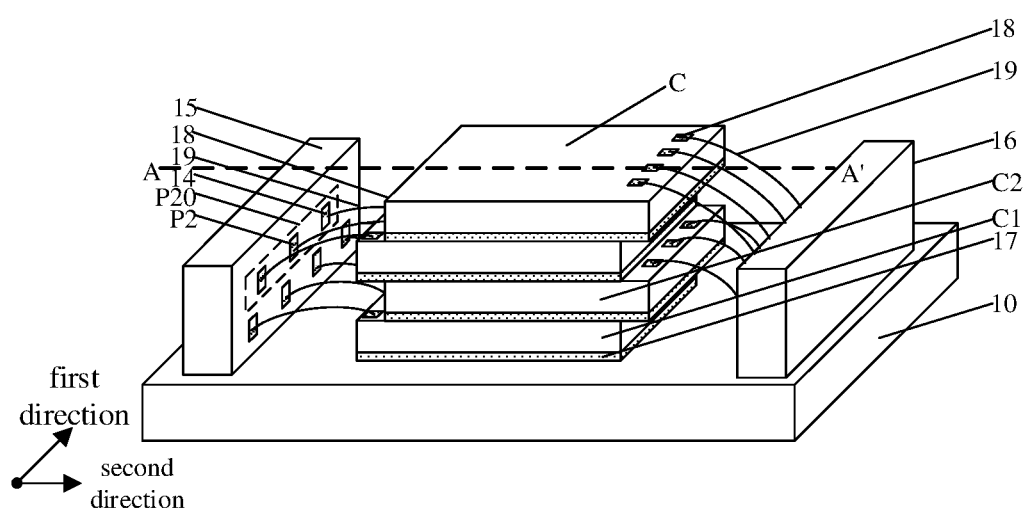
FIG. 3A is a perspective view of a semiconductor structure provided by another embodiment of the disclosure.
Figure 3B:
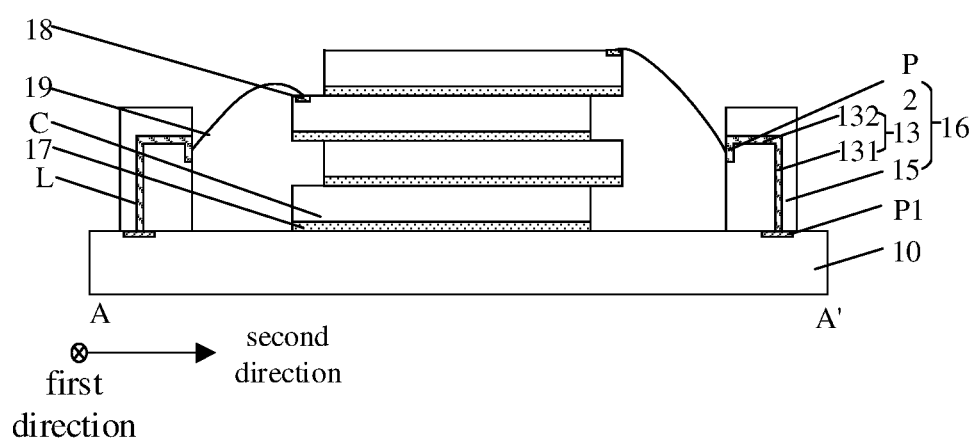
FIG. 3B is a schematic cross-section structure diagram taken along line A-A' of FIG. 3A.

FIGS. 1A, 2A and 3A are perspective views of the semiconductor structure provided by the embodiments of the disclosure, FIGS. 1B, 2B and 3B are schematic cross-section structure diagrams taken along line A-A' of FIGS. 1A, 2A and 3A, respectively, and FIG. 1C is a perspective view of a first pad and a connecting structure in FIG. 1A. The semiconductor structure provided by the embodiments of the disclosure will be described in further detail below with reference to FIGS. 1A to 3B.

As shown in FIGS. 1A to 1C, the semiconductor structure includes: a substrate 10, a first pad P1 being provided on the substrate; an adapter plate 16 located on the substrate 10, and the bottom surface of the adapter plate 16 covering the first pad P1, in which the adapter plate 16 includes a second pad P2 and a connecting structure L, the second pad P2 is located on any surface other than the bottom surface of the adapter plate 16, one end of the connecting structure L is connected with the first pad P1, and the other end of the connecting structure L is connected with the second pad P2.

The substrate 10 may be a rigid printed circuit board, a flexible printed circuit board, a rigid-flexible printed circuit board, or any combination thereof. In a specific embodiment, the substrate 10 is a multi-layer circuit board with various circuit elements disposed therein. In a more specific embodiment, the surface of the substrate 10 includes an insulating layer (not shown), the first pad P1 is located within the insulating layer (not shown), and the upper surface of the first pad P1 is flush with the upper surface of the insulating layer (not shown). A material of the first pad P1 may include tungsten (W), copper (Cu), titanium (Ti), tantalum (Ta), titanium nitride (TiN), tantalum nitride (TaN), metal silicide, metal alloy, conductive carbon, or any combination thereof. The material of the insulating layer (not shown) may be a solder resist.

In an embodiment, the adapter plate 16 further includes a sealing layer 15, the bottom of which covers the first pad P1. The second pad P2 is located on a side surface of the sealing layer 15, but not limited thereto, the second pad P2 may also be located on the top surface of the sealing layer 15 in other embodiments. A material of the sealing layer 15 is an insulating material, for example, an epoxy resin molding compound. A material of the second pad P2 may be the same as or different from the material of the first pad P1. Optionally, the material of the second pad P2 may include a metal, a metal nitride, a metal silicide, a metal alloy, a conductive carbon, or any combination thereof.

In an embodiment, the second pad P2 includes multiple second sub-pad sets P20 at different levels, and each of the second sub-pad sets P20 includes multiple second sub-pads 14 arranged in a first direction. Optionally, the first direction is parallel to the surface of the substrate 10. As shown in FIG. 1A, the multiple second sub-pad sets P20 are exposed to the side surface of the sealing layer 15 and are arranged in a direction perpendicular to the substrate 10.

Referring to FIGS. 1A and 1C, in an embodiment, the first pad P1 includes at least one first sub-pad set P10, and the first sub-pad set P10 includes multiple first sub-pads 11 arranged in the first direction. In a specific embodiment, a distance between two of the first sub-pads 11 adjacent in the first direction in the first sub-pad set P10 is smaller than a distance between two of the second sub-pads 14 adjacent in the first direction in the second sub-pad set P20. In other words, in the first direction the arrangement of the second sub-pads 14 is sparser than the arrangement of the first sub-pads 11. In this way, during wire bonding, the adjacent second sub-pads 14 and the bonding wires connected with the adjacent second sub-pads 14 are not easily short-circuited, thus improving the reliability of the semiconductor structure. It should be understood that, the first sub-pad 11 and the second sub-pad 14 are in one-to-one correspondence. The reason why the distance between two adjacent second sub-pads 14 in the first direction is greater than the distance between two adjacent first sub-pads 11 is as following. Each first sub-pad set P10 corresponds to multiple second sub-pad sets P20 at different levels, and thus the number of the second sub-pads 14 in each second sub-pad set P20 is less than the number of the first sub-pads 11 in each first sub-pad set P10, hence the distance between two adjacent second sub-pads 14 in each second sub-pad set P20 is greater than the distance between two adjacent first sub-pads 11 in each first sub-pad set P10. As shown in FIG. 1C, each of the first sub-pad sets P10 corresponds to two of the second sub-pad sets P20 at different levels, but not limited thereto, each of the first sub-pad sets P10 may also correspond to more of the second sub-pad sets P20 at different levels, e.g. 3, 4, or 5.

Each of the adapter plates 16 shown in FIGS. 1A to 1C covers one set of the first sub-pad sets P10, but not limited thereto. As shown in FIGS. 2A to 2B, in another embodiment, each adapter plate 16 covers multiple sets of the first sub-pad sets P10, which are arranged in a second direction on the substrate 10. In a specific embodiment, the second direction is perpendicular to the first direction.

It should be noted that, the number of the first sub-pad sets and the number of the second sub-pad sets are not limited to those shown in FIGS. 1A to 3B, and the number of the first sub-pad sets and the number of the second sub-pad sets may be more or less.

Referring further to FIG. 1C, the connecting structure L is located within the sealing layer 15, the second pad P2 and the first pad P1 are connected in one-to-one correspondence by the connecting structure L, the connecting structure L is arranged in the same manner as the first pad P1, and the height of the connecting structure L determines the height of the second pad P2. In an embodiment, the connecting structure L includes multiple sub-connecting structures 13, in which the sub-connecting structures 13 have different heights. In some embodiment, the connecting structure L includes multiple sub-connecting structures 13 arranged in the first direction, in which two adjacent ones of the sub-connecting structures 13 have different heights.

In an embodiment, each of the sub-connecting structures 13 includes a first connecting sub-part 131 and a second connecting sub-part 132 extending in different directions and connected to each other; the first connecting sub-section 131 is connected to the first pad P1, and the second connecting sub-section 132 is connected to the second pad P2. In a specific embodiment, the extension direction of the first connecting sub-part 131 is perpendicular to the substrate 10, and the extension direction of the second connecting sub-part 132 is parallel to the substrate 10. The first connecting sub-part 131 and the second connecting sub-part 132 may be formed simultaneously or sequentially; the material of the first connecting sub-part 131 and the second connecting sub-part 132 may include a metal, a metal nitride, a metal silicide, a metal alloy, a conductive carbon or any combination thereof. In a specific embodiment, the materials of the first pad P1, the connecting structure L, and the second pad P2 are the same, for example, copper (Cu).

In an embodiment, the semiconductor structure further includes one or more dies C disposed on the substrate 10, a bonding pad 18 provided on the surface of the die C. The bonding pad is electrically connected to the second sub-pad set P20 via bonding wire 19. Here, the die C may be a memory, such as dynamic random access memory (DRAM). The bonding wires 19 are used for conducting signals, and the material thereof may be a metal, for example gold (Au).

In an embodiment, multiple of the dies C are disposed on the substrate 10, and the side surfaces of multiple of the dies C are aligned in a direction perpendicular to the substrate 10, as shown in FIGS. 1A to 2B, but not limited thereto. In other embodiments, two adjacent dies C may be offset from each other by a predetermined distance as shown in FIGS. 3A to 3B.

In an embodiment, as shown in FIGS. 1A to 1B, the multiple dies C includes two dies C1, C2 stacked on each other, and the multiple second sub-pad sets P20 include two second sub-pad sets P21, P22 at different levels, in which the upper die C2 of the two dies C1 and C2 is electrically connected with the upper second sub-pad set P22 of the two second sub-pad sets P21 and P22, and the lower die C1 of the two dies C1 and C2 is electrically connected with the lower second sub-pad set P21 of the two second sub-pad sets P21 and P2, but not limited thereto. In another embodiment, the two dies C1, C2 stacked on each other may also be electrically connected to two second sub-pad sets P20 having the same height, respectively, in which the two second sub-pad sets P20 are located on the side surfaces of the two adapter plates 16, respectively, as shown in FIGS. 3A to 3B.

In an embodiment, each of the dies C further includes an adhesive layer 17 located on the lower surface of the die C for sequentially bonding one or more of the dies C to the substrate 10. The adhesive layer 17 includes an adhesive film, for example, a direct adhesive film (DAF).

In an embodiment, the number of the adapter plates 16 is multiple, and the multiple adapter plates 16 are arranged around the one or more dies C. As shown in FIGS. 1A to 1B, in some embodiments, the number of the adapter plates 16 is two, and the two adapter plates 16 are respectively located on both sides of the one or more dies C, but not limited thereto, the number of the adapter plates 16 may be more or less, for example 1, 3 or 4.

In an embodiment, the semiconductor structure further includes an encapsulation layer (not shown) covering at least the die C and the adapter plate 16. It will be understood that the encapsulation layer (not shown) further covers the bonding wires 19 and part of the surface of the substrate 10.

In summary, in the embodiments of the disclosure, the first pad P1 located in the substrate is led to any surface other than the bottom surface of the adapter plate 16 through a connecting structure L to form a second pad P2. The adapter plate 16 is located on the substrate 10, and its side surface has a large area, so that the arrangement density of the second pads P2 can be smaller than the arrangement density of the first pads P1, and the possibility of short circuit between adjacent second pads P2 and between adjacent bonding wires 19 can be reduced during wire bonding. The semiconductor structure provided by the embodiments of the disclosure may have a smaller substrate size, a larger number of pads, and a lower pad arrangement density, compared to conventional techniques. In addition, the presence of the adapter plate 16 can also shorten the length of the bonding wires 19, thereby reducing heat generation and signal attenuation.

Figure 4:
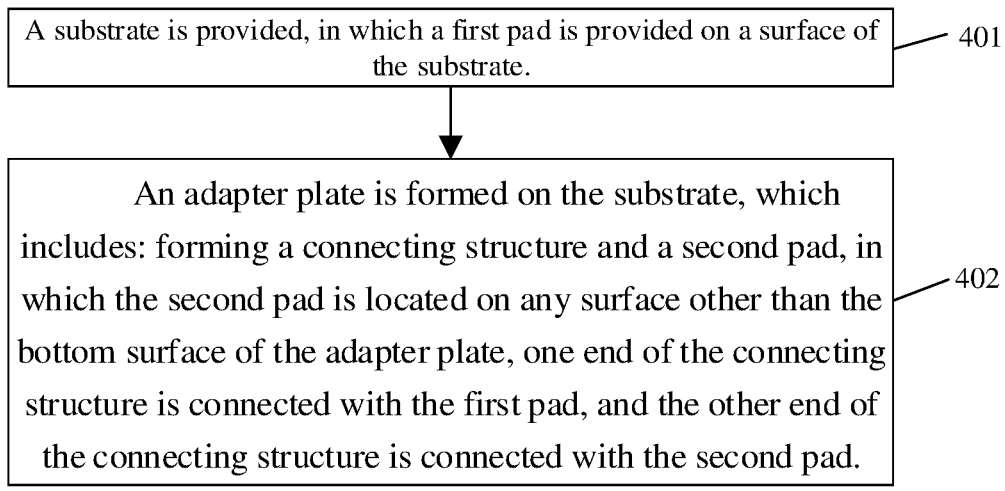
FIG. 4 is a flow block diagram of a manufacturing method of a semiconductor structure provided by the embodiments of the disclosure.

The embodiment of the disclosure also provides a manufacturing method of a semiconductor structure, as shown in FIG. 4, the method includes the following operations.

Operation 401, a substrate is provided, in which a first pad is provided on a surface of the substrate;

Operation 402, an adapter plate is formed on the substrate, which includes: forming a connecting structure and a second pad, in which the second pad is located on any surface other than the bottom surface of the adapter plate, one end of the connecting structure is connected with the first pad, and the other end of the connecting structure is connected with the second pad.

Next, the manufacturing method of a semiconductor structure provided by the embodiments of the disclosure will be described in further detail with reference to FIGS. 5A to 10B. FIGS. 5A, 6A, 7A, 8A, 9A and 10A are perspective views in the manufacturing method of the semiconductor structure provided by the embodiments of the disclosure in different process operations, and FIGS. 5B, 6B, 7B, 8B, 9B and 10B are schematic cross-section structural diagrams taken along line A-A' of FIGS. 5A, 6A, 7A, 8A, 9A and 10A, respectively.

Figure 5A:
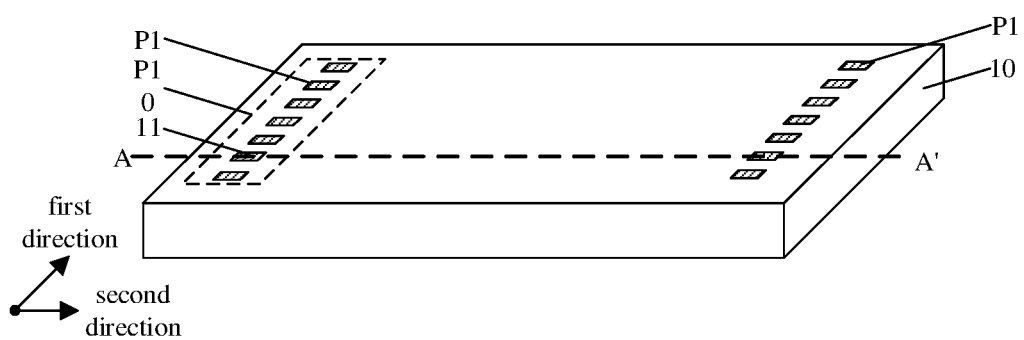
FIG. 5A is a first process flow diagram of the semiconductor structure provided by the embodiments of the disclosure.
Figure 5B:
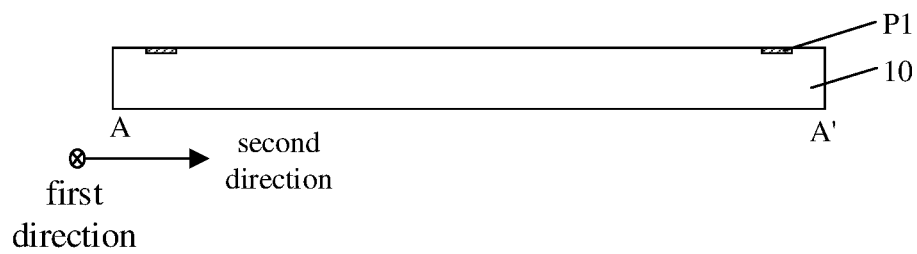
FIG. 5B is a second process flow diagram of the semiconductor structure provided by the embodiments of the disclosure.

First, Operation 401 is performed to provide a substrate 10, in which a first pad P1 is provided on the surface of the substrate; as shown in FIGS. 5A to 5B.

The substrate 10 may be a rigid printed circuit board, a flexible printed circuit board, a rigid-flexible printed circuit board, or any combination thereof. In a specific embodiment, the substrate 10 is a multi-layer circuit board with various circuit elements disposed therein. In a more specific embodiment, an insulating layer is provided on the surface of the substrate (not shown), the first pad P1 is located within the insulating layer (not shown), and the upper surface of first pad P1 is flush with the upper surface of the insulating layer (not shown). A material of the first pads P1 may include tungsten (W), copper (Cu), titanium (Ti), tantalum (Ta), titanium nitride (TiN), tantalum nitride (TaN), metal silicide, metal alloy, conductive carbon, or any combination thereof. A material of the insulating layer (not shown) may be a solder resist.

In an embodiment, each first pad P1 includes at least one first sub-pad set P10, and the first sub-pad set P10 includes multiple first sub-pads 11 arranged in a first direction.

The number of the first sub-pad sets P10 shown in FIGS. 5A-5B is two, on which two adapter plates 16 (see FIGS. 10A-10B) are formed respectively, i.e. each adapter plate 16 covers one of the first sub-pad sets P10, but not limited thereto. the number of the first sub-pad sets P10 may be more, and the number of the first sub-pad sets P10 covered by each of the adapter plates 16 may be more. As shown in FIGS. 2A-2B, in an embodiment, the multiple first sub-pad sets P10 covered by the same adapter plate 16 are arranged in a second direction. In a specific embodiment, the second direction is perpendicular to the first direction.

Next, Operation 402 is performed, and as shown in FIGS. 6A to 10B, adapter plates 16 are formed on the substrate 10, and forming each of the adapter plates on the substrate includes forming a connecting structure L and a second pad P2 located on any surface other than the bottom surface of the adapter plate 16, in which one end of the connecting structure L is connected with the first pad P1, and the other end of the connecting structure L is connected with the second pad P2.

In an embodiment, forming the adapter plate 16 on the substrate 10 further includes: forming a sealing layer 15 on the substrate 10, in which the sealing layer 15 covers the connecting structure L, and the second pad P2 is located on a side surface of the sealing layer 15, but not limited thereto, in other embodiments, the second pad P2 may also be formed on a top surface of the sealing layer 15. The sealing layer 15 may be formed by a molding process, and a material of the sealing layer 15 is an insulating material, for example, an epoxy resin molding compound.

In an embodiment, forming the connecting structure L and the second pad P2 includes the following operations.

Figure 6A:
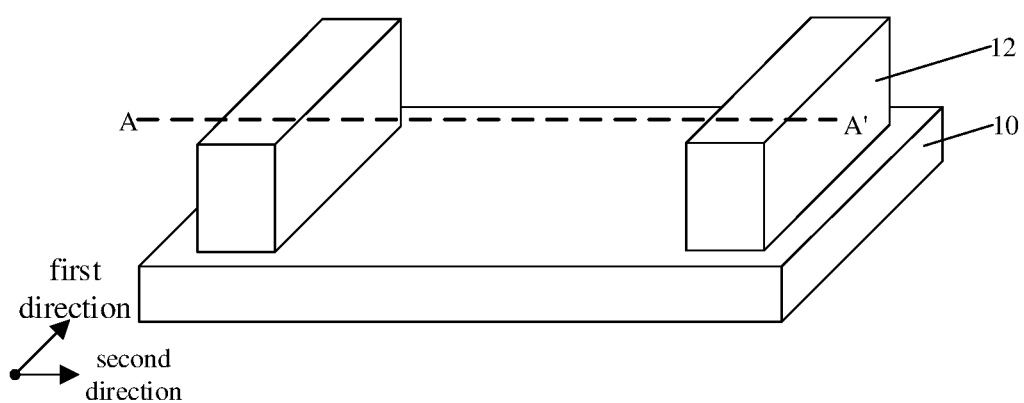
FIG. 6A is a third process flow diagram of the semiconductor structure provided by the embodiments of the disclosure.
Figure 6B:
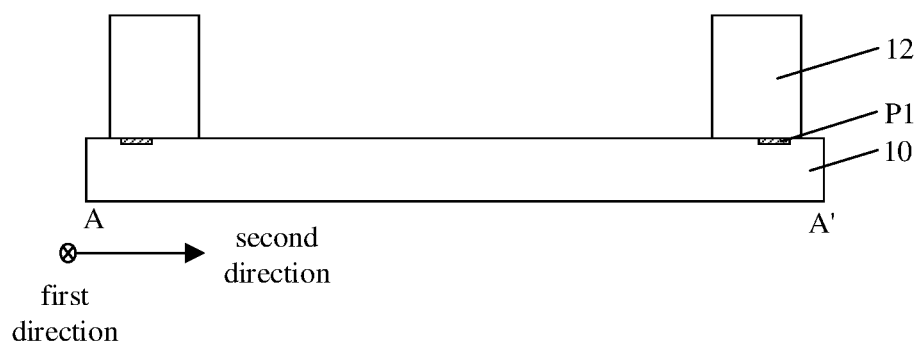
FIG. 6B is a fourth process flow diagram of the semiconductor structure provided by the embodiments of the disclosure.

A sacrificial layer 12 is formed on the substrate 10, and the sacrificial layer 12 covers the first pad P1, as shown in FIGS. 6A to 6B.

Figure 7A:
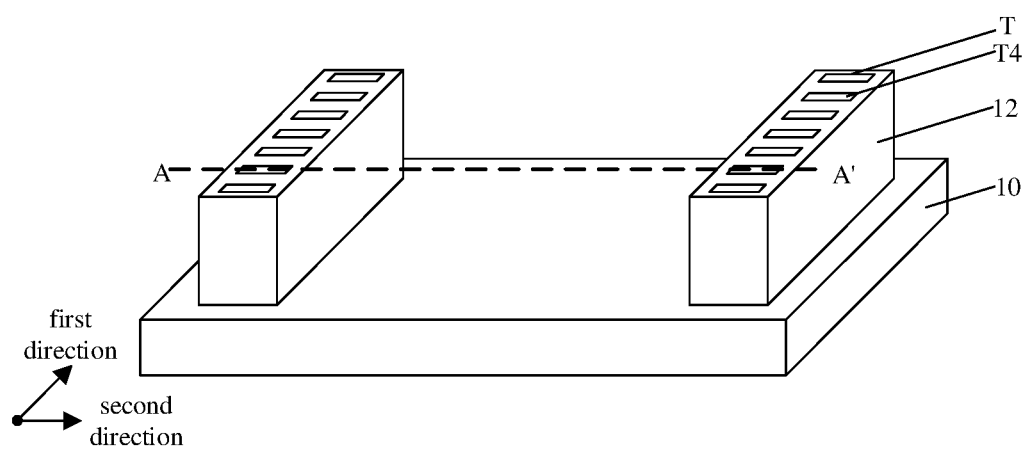
FIG. 7A is a fifth process flow diagram of the semiconductor structure provided by the embodiments of the disclosure.
Figure 7B:
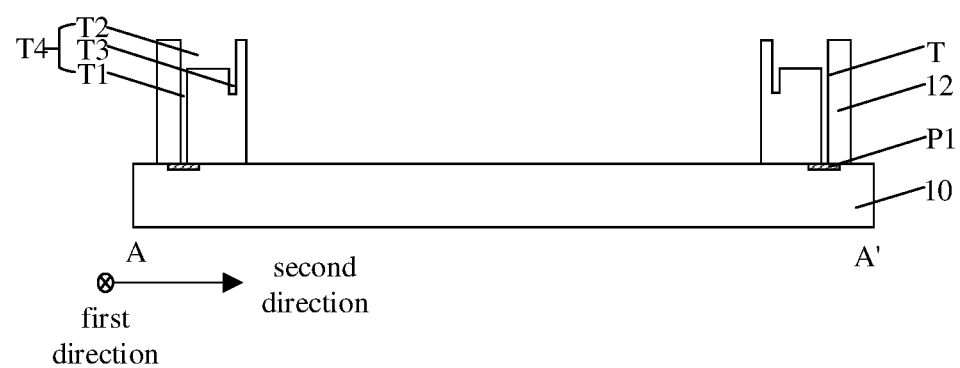
FIG. 7B is a sixth process flow diagram of the semiconductor structure provided by the embodiments of the disclosure.

The sacrificial layer 12 is etched to form a groove T in the sacrificial layer 12 as shown in FIGS. 7A to 7B.

Figure 8A:
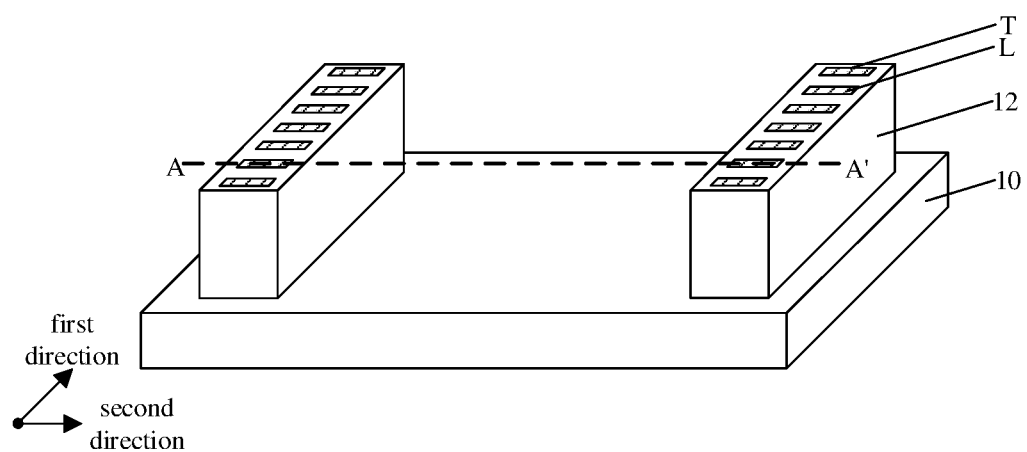
FIG. 8A is a seventh process flow diagram of the semiconductor structure provided by the embodiments of the disclosure.
Figure 8B:
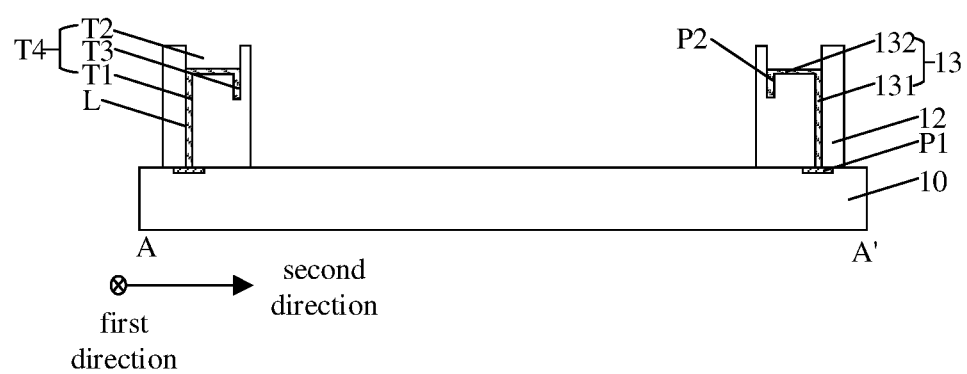
FIG. 8B is an eighth process flow diagram of the semiconductor structure provided by the embodiments of the disclosure.

A conductive material is filled in the groove T to form the connecting structure L and the second pad P2, as shown in FIGS. 8A to 8B.

Figure 9A:
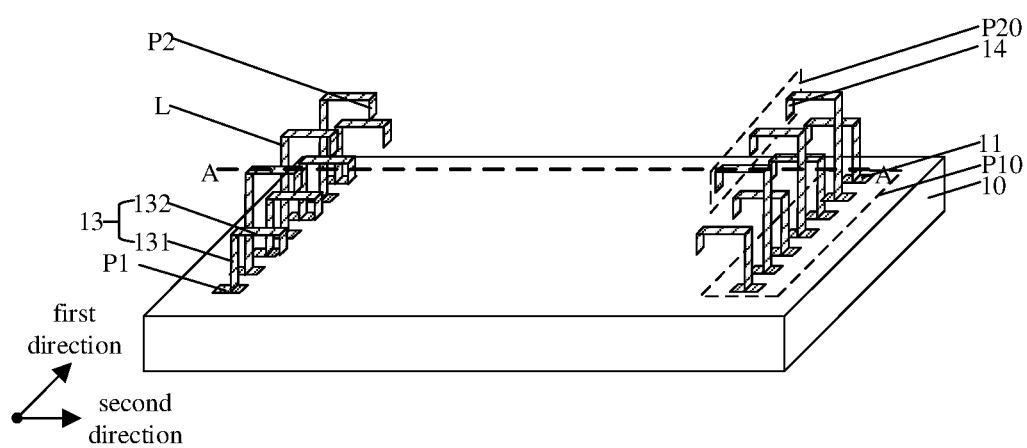
FIG. 9A is a ninth process flow diagram of the semiconductor structure provided by the embodiments of the disclosure.
Figure 9B:
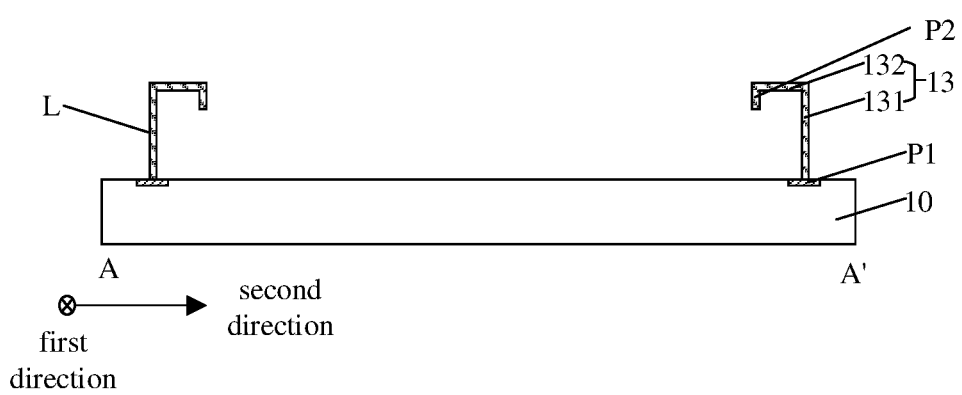
FIG. 9B is a tenth process flow diagram of the semiconductor structure provided by the embodiments of the disclosure.
Figure 10A:
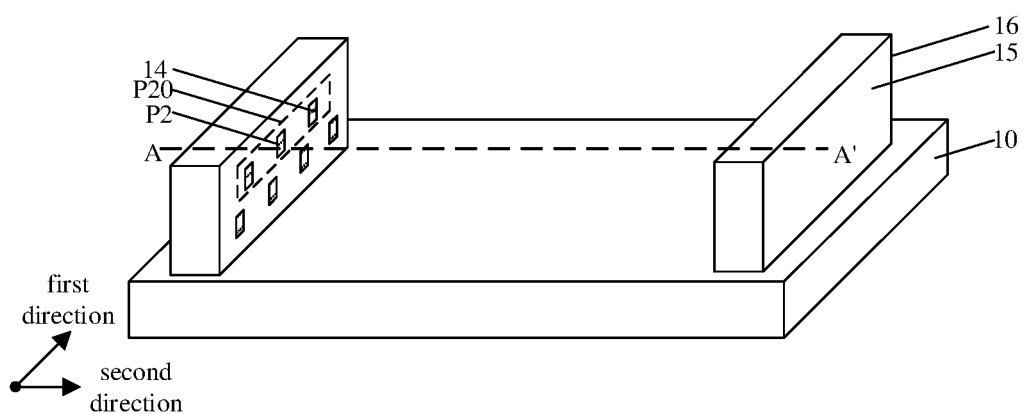
FIG. 10A is an eleventh process flow diagram of the semiconductor structure provided by the embodiments of the disclosure.
Figure 10B:
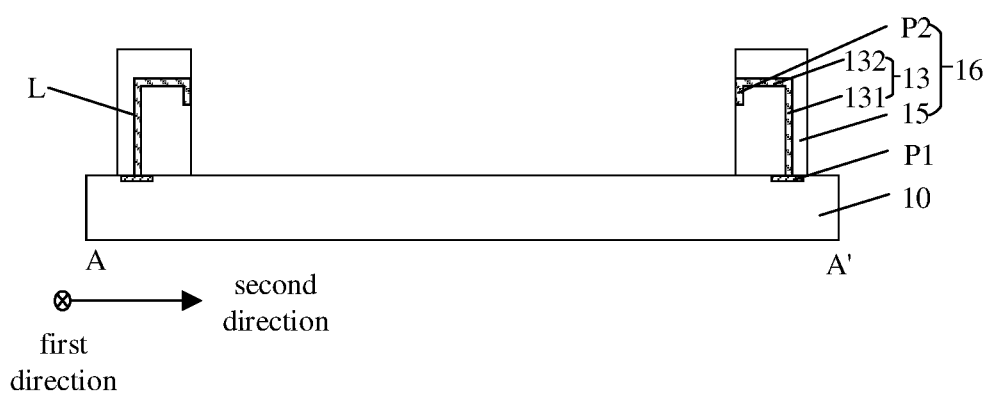
FIG. 10B is a twelfth process flow diagram of the semiconductor structure provided by the embodiments of the disclosure.

The sacrificial layer 12 is removed, as shown in FIGS. 9a to 9b.

The forming process of the conductive material may be chemical vapor deposition (CVD), plasma enhanced CVD (PECVD), physical vapor deposition (PVD), atomic layer deposition (ALD), electroplating, chemical plating, sputtering, and the like. The conductive material may be the same as or different from the material of the first pad P1. Optionally, the conductive material may include a metal, a metal nitride, a metal silicide, a metal alloy, a conductive carbon, or any combination thereof. In an embodiment, the materials of the first pad P1, the connecting structure L and the second pad P2 are the same, for example, copper (Cu).

Referring again to FIGS. 7A to 7B, in an embodiment, the groove T includes multiple sub-grooves T4 arranged in the first direction, each of the sub-grooves T4h includes a first groove sub-part T1, a second groove sub-part T2 and a third groove sub-part T3 which are connected sequentially with one another; etching the sacrificial layer 12 includes the following operations.

The first groove sub-part T1 is formed by etching downward from the top surface of the sacrificial layer 12, and the first groove sub-part T1 exposes the first pad P1.

The second groove sub-part T2 is formed by etching down from the top surface of the sacrificial layer 12, and a depth of the second groove sub-part T2 in the vertical direction is smaller than the depth of the first groove sub-part T1 in the vertical direction;

The third groove sub-part T3 is formed by etching down from the top surface of the sacrificial layer 12, and a depth of the third groove sub-part T3 in the vertical direction is greater than the depth of the second groove sub-part T2 in the vertical direction and is smaller than the depth of the first groove sub-part T1 in the vertical direction.

Optionally, a material of the sacrificial layer 12 may be a photoresist, and the groove T is formed in the sacrificial layer 12 by performing exposure and development processes on the sacrificial layer 12. The first groove sub-part T1, the second groove sub-part T2, and the third groove sub-part T3 having different depths can be obtained by adjusting the exposure time, the beam radiation dose, or the development time.

Referring again to FIGS. 8A to 8B, in an embodiment, the groove T is filled with the conductive material to form the connecting structure L and the second pad P2, which includes the following operations.

The first groove sub-parts T1 and the second groove sub-parts T2 are filled with the conductive material to form the connecting structure L, and the third groove sub-parts T3 are filled with the conductive material to form the second pad P2.

Specifically, the connecting structure L includes multiple sub-connecting structures 13 uniformly arranged in the first direction. In a particular embodiment, each of the sub-connecting structures 13 includes a first connecting sub-part 131 and a second connecting sub-part 132 extending in different directions and connected to each other; in which the first connecting sub-part 131 is formed by filling the conductive material in the first groove sub-part T1, and the second connecting sub-part 132 is formed by filling the conductive material in the second groove sub-part T2.

More specifically, the second pad P2 includes multiple second sub-pad sets P20 at different levels, and each of the second sub-pad sets P20 includes multiple second sub-pads 14 arranged in the first direction.

It will be understood that, the depth of a second groove sub-part T2 in the vertical direction determines the height of the sub-connecting structure 13, and the depth of the second groove sub-part T2 in the vertical direction and the depth of the third groove sub-part T3 in the vertical direction determine the height of the second sub-pad 14. In an embodiment, the second groove sub-parts T2 of the sub-grooves T4, which are adjacent in the first direction, have different depths in the vertical direction, and the third groove sub-parts T3 in the sub-grooves T4, which are adjacent in the first direction, has different depths in the vertical direction, so that the adjacent two of the sub-connecting structures 13 finally formed have different heights, and the second sub-pads 14 connected to the adjacent two of sub-connecting structures 13 also have different heights. The first sub-pads 11 and the second sub-pads 14 are in one-to-one correspondence, and each first sub-pad set P10 corresponds to multiple second sub-pad sets P20 at different levels. Therefore, the distance between the second sub-pads 14 adjacent in the first direction in the second sub-pad set P20, is greater than the distance between the first sub-pads 11 adjacent in the first direction in each of the first sub-pad sets P10. In other words, in the first direction, the second sub-pads 14 are arranged more sparsely than the first sub-pads 11. Therefore, the adjacent second sub-pads 14 and the bonding wires connected to the adjacent second sub-pads 14 are not easily short-circuit during wire bonding, and reliability of the semiconductor structure is improved. The semiconductor structure provided by the embodiments of the disclosure may have a smaller substrate size, more pads, and a lower pad arrangement density, compared to conventional techniques.

Referring again to FIG. 9A each of the first sub-pad sets P10 corresponds to two of the second sub-pad sets P20 at different levels, but not limited thereto, each of the first sub-pad sets P10 may also correspond to more of the second sub-pad sets P20 at different levels, e.g. 3, 4, or 5.

In an embodiment, the method further includes: fixing at least one die C on the substrate 10, in which bond pads 18 are provided on the surface of the die C; electrically connecting each bond pad 18 to the second pad P2 using a bonding wire 19, to form a semiconductor structure as shown in FIGS. 1A to 1B. The bonding wires 19 are used for conducting signals. The embodiments of the disclosure can effectively shorten the lengths of the bonding wires 19 by leading the first pad P1 on the substrate 10 to the side surface of the adapter plate 16 to form the second pad P2, and the bonding wires 19 are directly connected with the second pad P2, thereby enhancing the signal transmission performance and reducing heat generation and signal attenuation. In the embodiments, the die C may be a memory, such as dynamic random access memory (DRAM). The material of the bonding wires 19 may be a metal, for example gold (Au).

In an embodiment, the number of the dies C disposed on the substrate 10 is multiple, and the side surfaces of the multiple dies C are aligned in a direction perpendicular to the substrate 10, as shown in FIGS. 1A to 2B, without limited thereto, in other embodiments, two adjacent dies C may be offset from each other by a predetermined distance as shown in FIGS. 3A to 3B.

In an embodiment, the multiple dies C includes two dies C1, C2 stacked on each other, and multiple second sub-pad sets P20 includes two second sub-pad sets P21, P22 at different levels, in which the upper die C2 of the two dies C1 and C2 is electrically connected with the upper second sub-pad set P22 of the two second sub-pad sets P21 and P22, and the lower die C1 of the two dies C1 and C2 is electrically connected with the lower second sub-pad set P21 of the two second sub-pad sets P21 and P22, as shown in FIGS. 1A to 1B, without limited thereto. In another embodiment, the two dies C1, C2 stacked on each other may also be electrically connected to two second sub-pad sets P20 having the same height, respectively, in which the two second sub-pad sets P20 are located on the side surfaces of the two adapter plates 16, respectively, as shown in FIGS. 3A to 3B.

In an embodiment, the die C further include an adhesive layer 17 located on the lower surface of the die C for sequentially bonding one or more of the dies C to the substrate 10. The adhesive layer 17 includes an adhesive film, for example, a direct adhesive film (DAF).

In an embodiment, the number of the adapter plates 16 is multiple, and the multiple adapter plates 16 are arranged around the one or more dies C. As shown in FIGS. 1A to 1B, in some embodiments, the number of the adapter plates 16 is two, and the two adapter plates 16 are respectively located on both sides of the one or more dies C, but not limited thereto, the number of the adapter plates 16 may be more or less for example, 1, 3, or 4.

In an embodiment, the method further includes forming an encapsulation layer (not shown), which covers at least the die C and the adapter plate 16. It will be understood that the encapsulation layer (not shown) also covers the bonding wires 19 and part of the surface of the substrate 10.

It should be noted that, those skilled in the art can change the sequence of the above operations without departing from the scope of protection of the disclosure. The above are only optional embodiments of this disclosure, and are not intended to limit the scope of protection of this disclosure. Any modification, equivalent replacement and improvement made within the spirit and principles of this disclosure shall be included in the scope of protection of this disclosure.

In the embodiments of the disclosure, a first pad located P1 on a substrate is led to any surface of an adapter plate except a bottom surface by a connecting structure to form a second pad. The adapter plate is located on the substrate, and the side surface of the adapter plate has a larger area, so that the arrangement density of the second pads can be smaller than the arrangement density of the first pads, and the possibility of short circuit between adjacent second pads and between adjacent bonding wires can be reduced during wire bonding. The semiconductor structure provided by the embodiments of the disclosure may have a smaller substrate size, more pads, and a lower pad arrangement density, compared to conventional techniques. In addition, the existence of the adapter plate can also shorten the lengths of the bonding wires, thereby reducing heat generation and signal attenuation.

What is claimed is:

1. A semiconductor structure comprising:
   a substrate, a first pad being provided on the substrate; and
   an adapter plate located on the substrate, a bottom surface of which covers the first pad, wherein the adapter plate comprises a second pad and a connecting structure, the second pad is located on any surface other than the bottom surface of the adapter plate, one end of the connecting structure is connected with the first pad, and another end of the connecting structure is connected with the second pad;
   wherein the connecting structure comprises a plurality of sub-connecting structures, wherein the sub-connecting structures have different heights.

2. The semiconductor structure according to claim 1, wherein the adapter plate further comprises a sealing layer, a bottom of which covers the first pad, and the second pad is located on a side surface of the sealing layer.

3. The semiconductor structure according to claim 2, wherein the connecting structure is located within the sealing layer.

4. The semiconductor structure according to claim 1, wherein the second pad comprises a plurality of second sub-pad sets located at different levels, and each of the second sub-pad sets includes a plurality of second sub-pads arranged in a first direction; wherein the first pad comprises one or more first sub-pad sets, and each of the first sub-pad sets comprises a plurality of first sub-pads arranged in the first direction.

5. The semiconductor structure according to claim 4, wherein a distance between two adjacent ones of the first sub-pads in the first direction in each of the first sub-pad sets is smaller than a distance between two adjacent ones of the second sub-pads in the first direction in each of the second sub-pad sets.

6. The semiconductor structure according to claim 4, wherein the semiconductor structure further comprises one die or more dies disposed on the substrate, a bond pad is provided on a surface of each die, and the bond pad is electrically connected to the second sub-pad set by a bonding wire.

7. The semiconductor structure according to claim 6, wherein the more dies comprise two dies stacked on each other, and the plurality of second sub-pad sets comprise two second sub-pad sets located at different levels, wherein an upper die of the two dies is electrically connected with an upper second sub-pad set of the two second sub-pad sets, and a lower die of the two dies is electrically connected with a lower second sub-pad set of the two second sub-pad sets.

8. The semiconductor structure according to claim 7, wherein a number of the adapter plates is multiple, and the multiple adapter plates are disposed around the one die or more dies.

9. The semiconductor structure according to claim 6, wherein the semiconductor structure further comprises an encapsulation layer, and the encapsulation layer at least covers the die(s) and the adapter plate.

10. The semiconductor structure according to claim 1, wherein each of the sub-connecting structures comprises a first connecting sub-part and a second connecting sub-part extending in different directions and connected with each other, the first connecting sub-part is connected with the first pad, and the second connecting sub-part is connected with the second pad.

11. The semiconductor structure according to claim 10, wherein the first connecting sub-part extends in a direction perpendicular to the substrate and the second connecting sub-part extends in a direction parallel to the substrate.

12. The semiconductor structure according to claim 1, wherein the connecting structure includes a plurality of sub-connecting structures arranged in a first direction, wherein two adjacent ones of the sub-connecting structures have different heights.

13. A manufacturing method of a semiconductor structure, comprising:
   providing a substrate, a first pad being provided on a surface of the substrate; and
   forming an adapter plate on the substrate, which comprises: forming a connecting structure and a second pad, wherein the second pad is located on any surface other than a bottom surface of the adapter plate;
   wherein one end of the connecting structure is connected with the first pad, and another end of the connecting structure is connected with the second pad, and the connecting structure comprises a plurality of sub-connecting structures, wherein the sub-connecting structures have different heights.

14. The manufacturing method according to claim 13, wherein forming the adapter plate on the substrate further comprises: forming a sealing layer on the substrate, wherein the sealing layer covers the connecting structure, and the second pad is located on a side surface of the sealing layer.

15. The manufacturing method according to claim 13, wherein forming the connecting structure and the second pad comprises:
   forming a sacrificial layer on the substrate, the sacrificial layer covering the first pad;
   etching the sacrificial layer to form a groove in the sacrificial layer;

filling a conductive material in the groove to form the connecting structure and the second pad; and removing the sacrificial layer.

16. The manufacturing method according to claim 15, wherein the groove includes a plurality of sub-grooves uniformly arranged in a first direction, each of the sub-grooves includes a first groove sub-part, a second groove sub-part, and a third groove sub-part that are sequentially connected with one another; and etching the sacrificial layer comprises:

etching downward from the top surface of the sacrificial layer to form the first groove sub-part, wherein the first groove sub-part exposes the first pad;

etching down from the top surface of the sacrificial layer to form the second groove sub-part, wherein a depth of the second groove sub-part in a vertical direction is smaller than a depth of the first groove sub-part in the vertical direction; and etching down from the top surface of the sacrificial layer to form the third groove sub-part, wherein a depth of the third groove sub-part in the vertical direction is greater than the depth of the second groove sub-part in the vertical direction and is smaller than the depth of the first groove sub-part in the vertical direction.

17. The manufacturing method according to claim 16, wherein the second groove sub-parts of two adjacent ones of the sub-grooves in the first direction have different depths in the vertical direction, and the third groove sub-parts of two adjacent ones of the sub-grooves in the first direction have different depths in the vertical direction.

18. The manufacturing method according to claim 16, wherein filling the groove with the conductive material to form the connecting structure and the second pad comprises:

filling the first groove sub-part and the second groove sub-part with the conductive material to form the connecting structure, and filling the third groove sub-part with the conductive material to form the second pad.

19. The manufacturing method according to claim 13, further comprises:

securing at least one die on the substrate, a bond pad being provided on a surface of the die; and electrically connecting the bond pad to the second pad with a bonding wire.

* * * * *